(12) United States Patent
Kim et al.

(10) Patent No.: US 8,436,389 B2
(45) Date of Patent: May 7, 2013

(54) LIGHT EMITTING DEVICE HAVING A PLURALITY OF NON-POLAR LIGHT EMITTING CELLS AND A METHOD OF FABRICATING THE SAME

(75) Inventors: Kwang Choong Kim, Ansan-si (KR); Won Cheol Seo, Ansan-si (KR); Dae Won Kim, Ansan-si (KR); Dae Sung Kal, Ansan-si (KR); Kyung Hee Ye, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/482,851

(22) Filed: May 29, 2012

(65) Prior Publication Data

US 2012/0235158 A1 Sep. 20, 2012

Related U.S. Application Data

(62) Division of application No. 12/623,990, filed on Nov. 23, 2009, now Pat. No. 8,211,724.

(30) Foreign Application Priority Data

Dec. 31, 2008 (KR) .................. 10-2008-0138238

(51) Int. Cl.
 *H01L 33/00* (2010.01)
(52) U.S. Cl.
 USPC ............... 257/98; 257/96; 257/97; 438/34; 438/42
(58) Field of Classification Search ............ 257/96–98; 438/34, 42
 See application file for complete search history.

(56) References Cited

U.S. PATENT DOCUMENTS

| | | | |
|---|---|---|---|
| 7,095,061 | B2 | 8/2006 | Steigerwald et al. |
| 7,417,259 | B2 | 8/2008 | Sakai et al. |
| 7,709,849 | B1 | 5/2010 | Kal et al. |
| 7,723,736 | B2 | 5/2010 | Lee et al. |
| 7,838,891 | B2 | 11/2010 | Lee et al. |
| 7,846,755 | B2 | 12/2010 | Kal et al. |

(Continued)

FOREIGN PATENT DOCUMENTS

| | | |
|---|---|---|
| JP | 2004-006582 | 1/2004 |
| JP | 2008-130656 | 6/2008 |

(Continued)

OTHER PUBLICATIONS

Non-Final Office Action of U.S. Appl. No. 12/123,162, dated Aug. 5, 2010.

(Continued)

*Primary Examiner* — Telly Green
(74) *Attorney, Agent, or Firm* — H.C. Park & Associates, PLC

(57) ABSTRACT

The present invention relates to a light emitting device having a plurality of non-polar light emitting cells and a method of fabricating the same. Nitride semiconductor layers are disposed on a Gallium Nitride substrate having an upper surface. The upper surface is a non-polar or semi-polar crystal and forms an intersection angle with respect to a c-plane. The nitride semiconductor layers may be patterned to form light emitting cells separated from one another. When patterning the light emitting cells, the substrate may be partially removed in separation regions between the light emitting cells to form recess regions. The recess regions are filled with an insulating layer, and the substrate is at least partially removed by using the insulating layer.

11 Claims, 5 Drawing Sheets

U.S. PATENT DOCUMENTS

| | | |
|---|---|---|
| 7,880,181 B2 | 2/2011 | Yoon et al. |
| 2008/0087902 A1 | 4/2008 | Lee et al. |
| 2009/0085048 A1 | 4/2009 | Lee et al. |
| 2009/0267085 A1 | 10/2009 | Lee et al. |
| 2009/0283787 A1 | 11/2009 | Donofrio et al. |
| 2010/0078656 A1 | 4/2010 | Seo et al. |
| 2010/0117111 A1 | 5/2010 | Illek et al. |
| 2010/0148190 A1 | 6/2010 | Kim et al. |
| 2010/0163887 A1 | 7/2010 | Kim et al. |
| 2010/0163900 A1 | 7/2010 | Seo et al. |
| 2010/0244060 A1 | 9/2010 | Lee et al. |
| 2011/0140135 A1 | 6/2011 | Lee et al. |
| 2011/0169040 A1 | 7/2011 | Seo et al. |
| 2011/0175129 A1 | 7/2011 | Lee et al. |

FOREIGN PATENT DOCUMENTS

| | | |
|---|---|---|
| JP | 2008-141015 | 6/2008 |
| KR | 10-0599012 | 7/2006 |
| KR | 10-0838197 | 6/2008 |
| KR | 10-2010-0016631 | 2/2010 |
| KR | 10-2010-0036617 | 4/2010 |
| KR | 10-2010-0079843 | 7/2010 |
| WO | 2004/023568 | 3/2004 |
| WO | 2007-001124 | 1/2007 |

OTHER PUBLICATIONS

Notice of Allowance of U.S. Appl. No. 12/123,162, dated Nov. 30, 2010.
Non-Final Office Action of U.S. Appl. No. 12/623,990, dated Jan. 19, 2012.
Notice of Allowance of U.S. Appl. No. 12/623,990, dated Apr. 27, 2012.
Notice of Allowance of U.S. Appl. No. 12/624,011, dated Jan. 24, 2012.
Non-Final Office Action of U.S. Appl. No. 12/623,968, dated Jan. 17, 2012.
Notice of Allowance of U.S. Appl. No. 12/623,968, dated May 21, 2012.
Non-Final Office Action of U.S. Appl. No. 13/345,348, dated Apr. 13, 2012.
International Search Report of PCT/KR2011/006544 dated May 1, 2012.
Written Opinion of PCT/KR2011/006544 dated May 1, 2012.
Notice of Allowance dated Jun. 25, 2012 for related U.S. Appl. No. 13/345,348.

LIGHT EMITTING DEVICE HAVING A PLURALITY OF NON-POLAR LIGHT EMITTING CELLS AND A METHOD OF FABRICATING THE SAME

CROSS REFERENCE TO RELATED APPLICATIONS

This application is a divisional of U.S. patent application Ser. No. 12/623,990, filed on Nov. 23, 2009 and claims priority from and the benefit of Korean Patent Application No. 10-2008-0138238, filed on Dec. 31, 2008, which are both hereby incorporated by reference for all purposes as if fully set forth herein.

BACKGROUND OF THE INVENTION

1. Field of the Invention

Exemplary embodiments of the present invention relate to a light emitting device and a method of fabricating the same, and more particularly, to a light emitting device having a plurality of non-polar light emitting cells and a method of fabricating the same.

2. Discussion of the Background

Gallium Nitride (GaN)-based light emitting diodes (LEDs) are widely used for display and backlights. Further, LEDs have less electric power consumption and a longer lifespan as compared with conventional light bulbs or fluorescent lamps. Thus, LEDs have substituted conventional incandescent bulbs and fluorescent lamps. LED application areas have been expanded to the use thereof for general illumination.

In general, a GaN-based nitride semiconductor is grown on a heterogeneous substrate, such as a sapphire or silicon carbide substrate. The nitride semiconductor is mainly grown on a c-plane of such a substrate and has piezoelectric properties. A strong polarization electric field is generated in an active region of a multiple quantum well structure due to the piezoelectric properties. Therefore, it is difficult to increase the thickness of a light emitting layer. Thus, LEDs luminous power may not be significantly improved due to a decrease in light emitting recombination rate.

To prevent the generation of such a polarization electric field, a technique has recently been studied in which an a-plane nitride semiconductor is grown by machining GaN crystals grown on a c-plane sapphire substrate into a GaN substrate having a crystal face except the c-plane (e.g., an a-plane or m-plane), and using the GaN substrate as a growth substrate of a nitride semiconductor, or using an m-plane silicon carbide substrate or r-plane sapphire substrate as the growth substrate. The nitride semiconductor with the a-plane or m-plane has non-polar or semi-polar properties. Accordingly, it is expected that the nitride semiconductor has improved luminous power as compared to a polar LED having a polarization electric field.

LEDs generally emit light by forward current and require supply of DC current. Attempts have been made to develop a technique wherein a plurality of light emitting cells are driven by an AC power source by connecting the plurality of light emitting cells in reverse parallel or using a bridge rectifier, and LEDs fabricated by this technique have been commercialized. Further, an LED has been developed which can emit high-output and high-efficiency light by a high-voltage DC power source by forming a plurality of light emitting cells on a single substrate and connecting them in series.

To use a LED connected to a high-voltage AC or DC power source using a plurality of light emitting cells, the plurality of light emitting cells are electrically separated from one another and are connected through wires. Since a conventional sapphire substrate is an insulative substrate, the plurality of light emitting cells can be electrically isolated from one another when using a nitride semiconductor grown on the sapphire substrate. However, since a GaN substrate generally has characteristics of an n-type semiconductor, when a plurality of light emitting cells are fabricated using non-polar or semi-polar nitride semiconductor layers grown on the GaN substrate, there is a problem in that the light emitting cells may be electrically connected by the GaN substrate.

To solve such a problem, nitride semiconductor layers may be grown on a GaN substrate, and the GaN substrate may then be separated from the nitride semiconductor layers. Conventionally, nitride semiconductor layers are grown on a sapphire substrate, and the sapphire substrate is then separated from the nitride semiconductor layers using a laser lift-off process. However, since the GaN substrate and the nitride semiconductor layers grown thereon have similar physical and chemical properties, it is difficult to separate the nitride semiconductor layers from the GaN substrate.

SUMMARY OF THE INVENTION

Exemplary embodiments of the present invention provide a light emitting device having a plurality of non-polar light emitting cells and a method of fabricating the same.

Additional features of the invention will be set forth in the description which follows, and in part will be apparent from the description, or may be learned by practice of the invention.

Exemplary embodiments of the present invention disclose a method of fabricating a light emitting device having a plurality of non-polar light emitting cells. The method includes forming a substrate having an upper surface. The upper surface is a non-polar crystal face or a semi-polar crystal face. The upper surface forms an intersection angle with respect to a c-plane. The method includes disposing nitride semiconductor layers on the substrate, and patterning the nitride semiconductor layers to form light emitting cells separated from one another. The patterning includes partially removing the substrate in separation regions between the light emitting cells to form recess regions. The method further includes disposing an insulating layer to fill the recess regions, and removing, at least partially, the substrate so that the insulating layer is exposed.

Exemplary embodiments of the present invention disclose a light emitting device including a substrate, a plurality of non-polar or semi-polar light emitting cells, material layers, an insulating layer, at least one wire, and an interlayer insulating layer. The plurality of non-polar or semi-polar light emitting cells are formed on the substrate and spaced apart from one another. Each of the light emitting cells includes a first conductive-type upper semiconductor layer, an active layer, and a second conductive-type lower semiconductor layer. The material layers cover the first conductive-type upper semiconductor layer of the light emitting cells. The insulating layer is disposed on the light emitting cells and fills spaces between the material layers. The at least one wire electrically connects the light emitting cells under the insulating layer. The interlayer insulating layer covers the at least one wires. The interlayer insulating layer is interposed between the substrate and the light emitting cells.

Exemplary embodiments of the present invention disclose a light emitting device having a plurality of non-polar light emitting cells. The light emitting device includes a substrate, a plurality of non-polar light emitting cells, electrodes, an insulating layer, and at least one wire. The plurality of non-polar light emitting cells is spaced apart from one another on the substrate. Each of the light emitting cells includes a first conductive-type upper semiconductor layer, an active layer, and a second conductive-type lower semiconductor layer. The electrodes are formed on the light emitting cells. The electrodes are electrically connected to the second conductive-type lower semiconductor layer of one of the light emitting cells and extending towards another light emitting cell adjacent to the one of the light emitting cells. The insulating layer fills spaces between the light emitting cells above the electrodes. The insulating layer has at least one opening for exposing the electrodes. The at least one wire connects the light emitting cells. The at least one wire has one end electrically connected to the first conductive-type upper semiconductor layer of the one of the light emitting cells and another end of the at least one wire being electrically connected to the electrode electrically connected to the second conductive-type lower semiconductor layer of the adjacent light emitting cell through the at least one opening of the insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
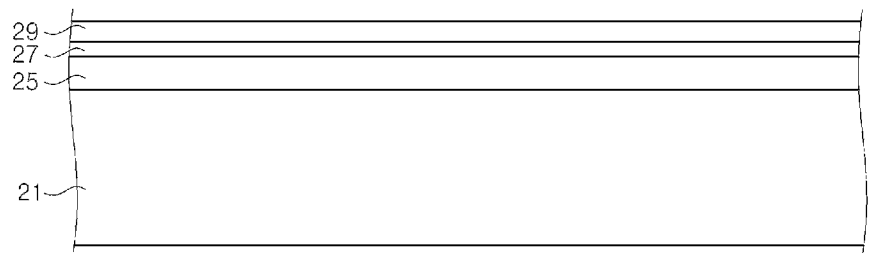
FIG. 1, FIG. 2, FIG. 3, FIG. 4, FIG. 5, FIG. 6, and FIG. 7 are sectional views illustrating a method of fabricating a light emitting device having a plurality of non-polar light emitting cells according to exemplary embodiments of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

"Non-polar" light emitting cell may refer to a light emitting cell formed of a nitride semiconductor in which a polarization electric field is not induced by a piezoelectric field. A "semi-polar" light emitting cell may refer to a light emitting cell formed of a nitride semiconductor having a polarization electric field relatively smaller than that of a nitride semiconductor having a c-plane as a growth plane. As long as not specifically mentioned hereinafter, the term "non-polar" includes the term "semi-polar."

Hereinafter, exemplary embodiments of the present invention are described in detail with reference to the accompanying drawings.

FIG. 1, FIG. 2, FIG. 3, FIG. 4, FIG. 5, FIG. 6, and FIG. 7 are sectional views illustrating a method of forming a plurality of non-polar light emitting cells according to exemplary embodiments of the present invention.

Referring to FIG. 1, nitride semiconductor layers 25, 27 and 29 may be grown on a substrate 21. The substrate 21 may be a GaN single crystal substrate, and an upper surface of the substrate 21 may be a crystal face that forms an intersection angle with respect to a c-plane. The upper surface of the substrate 21 may be, for example, an a-plane, an m-plane, or an r-plane. However, the upper surface of the substrate is not particularly limited, and may be another crystal face.

The substrate 21 may be prepared by separating a GaN single crystal, which may be grown on a c-plane sapphire substrate by a hydride vapor phase epitaxy (HVPE), from the sapphire substrate and then cutting the GaN single crystal along a crystal face that forms an intersection angle with respect to a c-plane. Alternatively, the substrate 21 may be prepared by growing a GaN layer on an r-plane sapphire substrate or m-plane silicon carbide substrate, and subsequently separating the GaN layer from the sapphire or silicon carbide substrate. The substrate 21 may be an a-plane GaN substrate.

The nitride semiconductor layers 25, 27 and 29 may include a first conductive-type semiconductor layer 25, an active layer 27, and a second conductive-type semiconductor layer 29. Each of the nitride semiconductor layers 25, 27 and 29 may be formed to have a single- or multi-layered structure. Particularly, the active layer 27 may be formed to have a multiple quantum well structure.

Before growing the first conductive-type nitride semiconductor layer 25, a nucleation layer and/or a buffer layer (not shown) formed of a nitride material first may be grown on the substrate 21. The buffer layer may be grown as a GaN-based material layer or GaN. The buffer layer may be formed to facilitate growth of the nitride semiconductor layers 25, 27 and 29, and may be an undoped layer or an impurity-doped layer.

The first conductive-type semiconductor layer 25, the active layer 27, and the second conductive-type semiconductor layer 29 may be formed of a III-N compound semiconductor and grown by a process such as metal organic chemical vapor deposition (MOCVD) or molecular beam epitaxy (MBE). The nitride semiconductor layers may be grown along the growth face of the GaN substrate 21. Accordingly, the nitride semiconductor layers may be grown as non-polar nitride semiconductors along the growth face of the GaN substrate 21.

The first and second conductive types may be n- and p-types or p- and n-types, respectively. For example, in some cases, the first conductive type may be an n-type semiconductor, and the second conductive type may be a p-type semiconductor.

Figure 2:
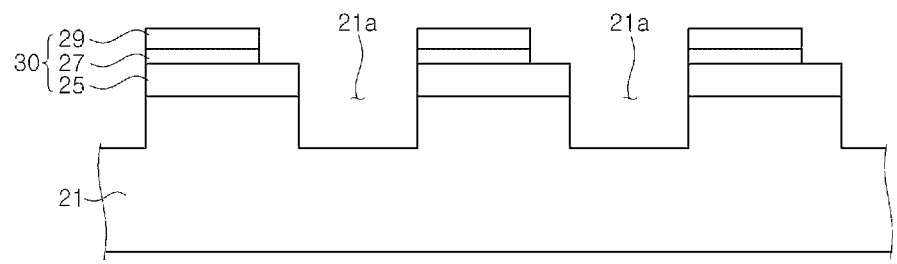

Referring to FIG. 2, the nitride semiconductor layers 25, 27, and 29 including the first conductive-type semiconductor layer 25, the active layer 27, and the second conductive-type semiconductor layer 29, may be patterned to form a plurality of light emitting cells 30. Each light emitting cell 30 may include a first conductive-type semiconductor layer 25, a second conductive-type semiconductor layer 29 positioned on one region of the first conductive-type semiconductor layer 25, and an active layer 27 interposed between the first conductive-type semiconductor layer 25 and the second conductive-type semiconductor layer 29. Each light emitting cell 30 may be formed by partially removing the second conductive-type semiconductor layer 29 and the active layer 27, such that a portion of the first conductive-type semiconductor layer 25 may be exposed.

While forming the light emitting cells 30, the substrate 21 may be partially etched in separation regions, thereby forming recess regions 21a. The recess regions 21a may be formed in a stripe shape to be spaced apart from one another, or in a mesh shape to be connected to one another.

Figure 3:
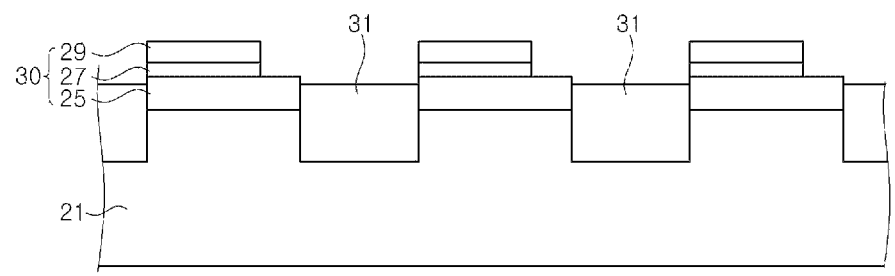

Referring to FIG. 3, an insulating layer 31 may be disposed to fill the recess regions 21a. The insulating layer 31 may be filled in the regions between the light emitting cells 30 such that top surfaces of the insulating layer 31 may be slightly below upper surfaces of the first conductive-type semiconductor layers 25. The insulating layer 31 may be formed of an insulating material, such as spin on glass (SOG), silicon oxide, and silicon nitride. The insulating layer 31 may be formed by applying or depositing an insulating material on the light emitting cells 30 and then partially removing the insulating material so that the upper surfaces of the first conductive-type semiconductor layers 25 are exposed.

Figure 4:
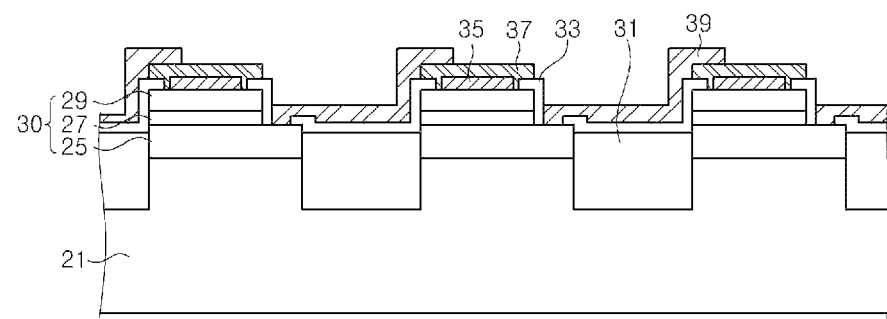

Referring to FIG. 4, a side insulating layer 33 for covering sides of the light emitting cells 30 may be formed on the insulating layer 31. The side insulating layer 33 may have openings through which upper portions of the light emitting cells 30 are exposed and also has openings through which the upper surfaces of the first conductive-type semiconductor layers 25 are exposed.

A reflective layer 35 may be formed on each of the light emitting cells 30 (e.g., on each of the second conductive-type semiconductor layers 29). The reflective layer 35 may be formed of, for example, Silver (Ag) or Aluminum (Al). Further, a protective metal layer 37 may be formed to cover the reflective layer 35. The protective metal layer 37 may cover the reflective layer 35 to prevent diffusion and oxidation of the reflective layer 35. The protective metal layer 37 may be formed to have a single- or multi-layered structure. For example, the protective metal layer may be formed of Nickel (Ni), Titanium (Ti), Tantalum (Ta), Platinum (Pt), Tungsten (W), Chromium (Cr), or Palladium (Pd).

Thereafter, wires 39 may be formed to electrically connect the light emitting cells 30. The wires 39 may connect the first conductive-type semiconductor layer 25 and second conductive-type semiconductor layer 29 of adjacent light emitting cells such that the light emitting cells 30 are connected in series. A wire 39 may connect the protective metal layer 37 and the first conductive-type semiconductor layer 25, and may be electrically connected to the second conductive-type semiconductor layer 29 through the protective metal layer 37 and the reflective layer 35. The reflective layer 35 and/or the protective metal layer 37 may be omitted, and the wire 39 may be directly connected to the second conductive-type semiconductor layer 29.

Figure 5:
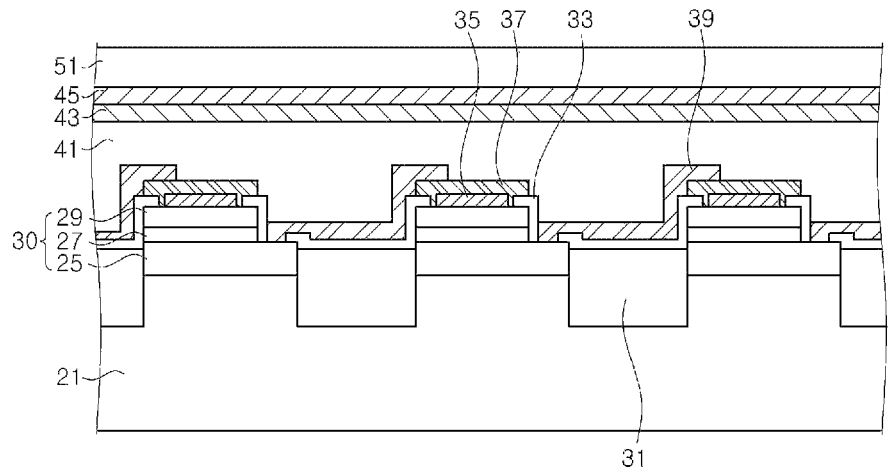

Referring to FIG. 5, after the wires 39 are formed, an interlayer insulating layer 41 may be formed to cover the light emitting cells 30. The interlayer insulating layer 41 may prevent the light emitting cells 30 from being short-circuited to one another.

A second substrate 51 may be bonded to the interlayer insulating layer 41. The second substrate 51 may be formed of a material having a thermal expansion coefficient similar to that of the GaN substrate 21. The second substrate 51 may be formed by forming a bonding metal 43 on the interlayer insulating layer 41, forming a bonding metal 45 on the second substrate 51, and then bonding the bonding metals 43 and 45 to each other.

Figure 6:
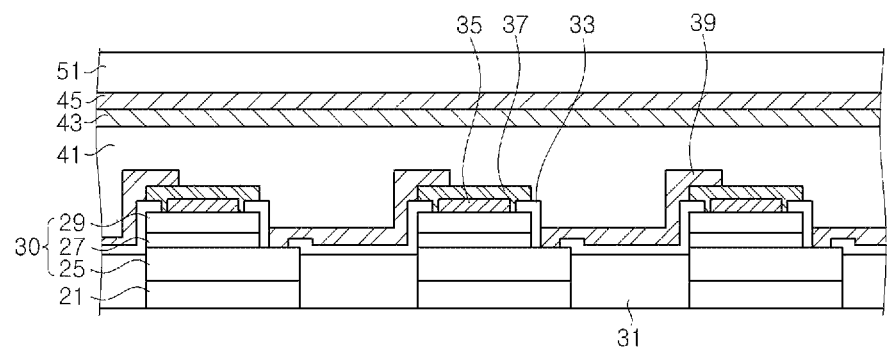

Referring to FIG. 6, after the second substrate 51 is bonded to the interlayer insulating layer 41, the GaN substrate 21 may be removed, at least partially. The GaN substrate 21 may be removed by a polishing or etching process. At this time, the insulating layer 31 filled in the recess regions are exposed.

The GaN substrate 21 has physical-chemical properties similar to those of the nitride semiconductor layers (e.g., 25, 27, and 29) grown thereon. In conventional art, it is difficult to separate the GaN substrate 21 from the nitride semiconductor layer. However, according to exemplary embodiments of the present invention, an interface between the GaN substrate 21 and the nitride semiconductor layers can be easily distinguished by the insulating layer 31. Accordingly, an end point may be easily determined in the polishing or etching process, so that the GaN substrate 21 can be partially or completely removed.

When the GaN substrate 21 is partially removed, the first nitride semiconductor layers 25 may still cover residual portions of the GaN substrate 21. If the GaN substrate 21 is completely removed, a buffer layer (not shown) may be coupled to the first nitride semiconductor layers 25, or the first nitride semiconductor layers 25 may be exposed.

Figure 7:
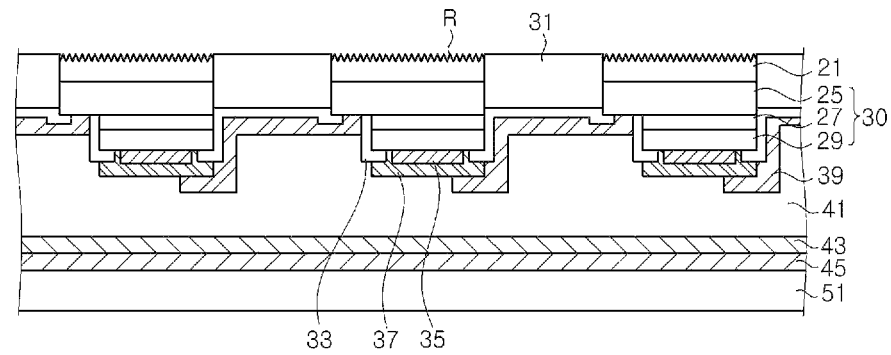

Referring to FIG. 7, after the GaN substrate 21 is removed, roughened surfaces R may be formed on the residual portions of the GaN substrate 21 (or the buffer layer) or the first nitride semiconductor layers 25. The roughened surface R may be formed using any suitable means, including, for example, photoelectrochemical (PEC) etching.

Accordingly, a light emitting device having a plurality of non-polar light emitting cells 30 spaced apart from one another on the second substrate 51 may be manufactured according to the method described above. The light emitting device comprises light emitting cells 30 connected in series by the wires 39, whereby the light emitting device can be driven by a high-voltage DC power source. Alternatively, a light emitting device may comprise a plurality of arrays connected in series by the wires 39. These arrays may be connected in reverse parallel, so that the light emitting device can be driven by a high-voltage AC power source.

Figure 8:
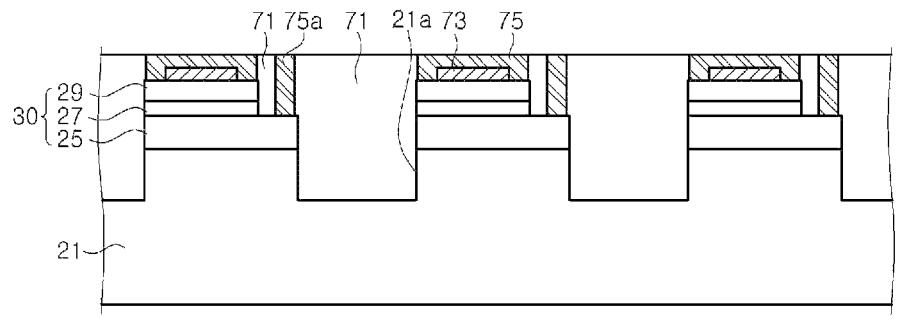
FIG. 8, FIG. 9, and FIG. 10 are sectional views illustrating a method of fabricating a light emitting device having a plurality of non-polar light emitting cells according to exemplary embodiments of the present invention.
Figure 9:
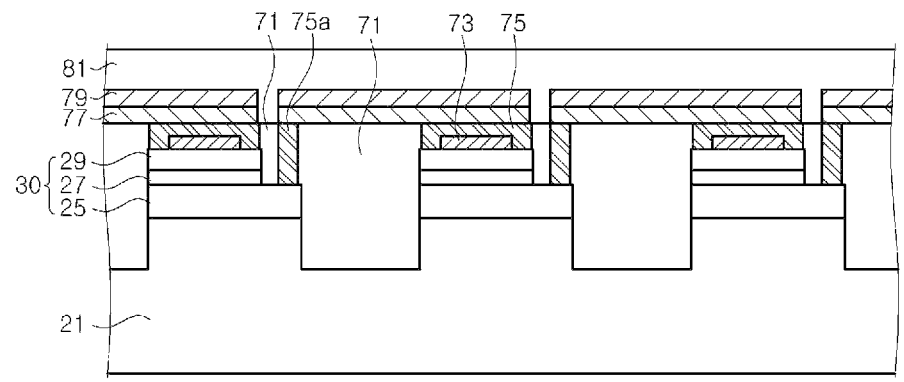
Figure 10:
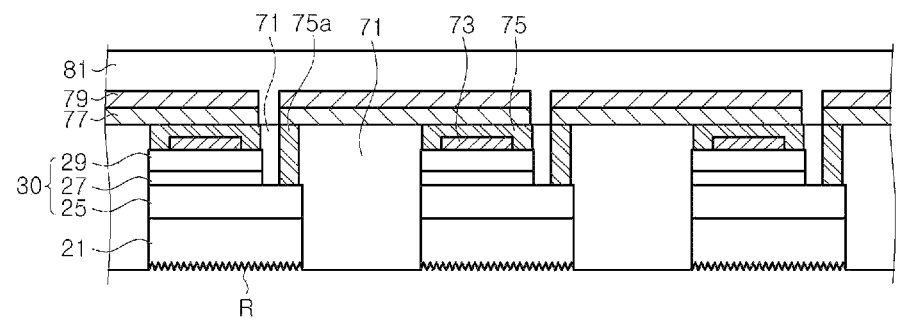

FIG. 8, FIG. 9, and FIG. 10 are sectional views illustrating a method of fabricating a light emitting device having a plurality of non-polar light emitting cells according to exemplary embodiments of the present invention.

Referring to FIG. 8, after the light emitting cells 30 are formed, an insulating layer 71 for covering the light emitting cells 30 may be formed. The insulating layer 71 may fill the recess regions 21a and may cover sides of the light emitting cells 30. The insulating layer 71 may have openings exposing portions of the first conductive-type semiconductor layers 25 and the second conductive-type semiconductor layers 29.

The insulating layer 71 may be formed by filling insulating material in the recess regions 21a, covering the light emitting cells 30, and then patterning the insulating material. Alternatively, the insulating layer 71 may be formed by filling insulating material in the recess regions 21a, and then forming a side insulating layer (not shown) for covering sides of the light emitting cells 30.

A reflective layer 73 and a protective metal layer 75 may be formed on the second conductive-type semiconductor layer 29. The opening on the first conductive-type semiconductor layer 25 may be filled with a metallic material 75a. The metallic material 75a may be the same material used for the protective metal layer 75.

Referring to FIG. 9, bonding metals 77 may be formed to electrically connect the first conductive-type semiconductor layer 25 of one of the light emitting cells 30 to the second conductive-type semiconductor layer 29 of another adjacent light emitting cell 30. The bonding metals 77 may be spaced apart from one another to connect the light emitting cells 30 in series. The bonding metals 77 may be formed on the insulating layer 71 to electrically connect the metallic materials formed in the openings of the insulating layer 71. Alternatively, the bonding metals 77 may electrically connect the first conductive-type semiconductor layers 25 to the second conductive-type semiconductor layers 29 through the openings.

Bonding metals 79 may be formed on a second substrate 81. The bonding metals 79 may be formed on and bonded to the bonding metals 77, respectively.

Referring to FIG. 10, the substrate 21 may be removed, at least partially, as described with reference to FIG. 6. After a portion of the substrate 21 is removed, roughened surfaces may be formed on residual portions of the substrate 21 (or the buffer layer) or the first nitride semiconductor layers 25.

In FIG. 8, FIG. 9, and FIG. 10, a light emitting device having light emitting cells 30 electrically connected by bonding metals 77 is described. The light emitting device may be driven by a high-voltage DC or AC power source depending on the electrical connection of the bonding metals 77.

FIG. 11, FIG. 12, FIG. 13, FIG. 14, and FIG. 15 are sectional views illustrating a method of fabricating a light emitting device having a plurality of non-polar light emitting cells according to exemplary embodiments of the present invention.

Figure 11:
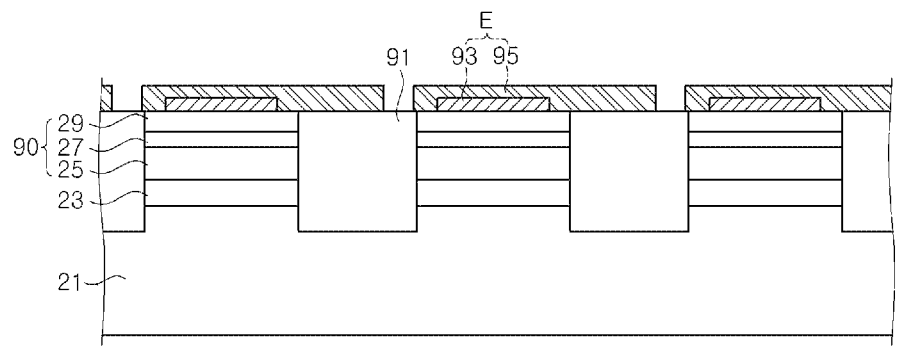
FIG. 11, FIG. 12, FIG. 13, FIG. 14, and FIG. 15 are sectional views illustrating a method of fabricating a light emitting device having a plurality of non-polar light emitting cells according to exemplary embodiments of the present invention.

Referring to FIG. 11, after the nitride semiconductor layers 25, 27, and 29 of FIG. 1 are formed, light emitting cells 90 separated from one another may be formed by patterning the nitride semiconductor layers 25, 27, and 29. Each of the light emitting cells 90 comprises a first conductive-type semiconductor layer 25, a second conductive-type semiconductor layer 29 formed on the first conductive-type semiconductor layer 25, and an active layer 27 interposed between the first conductive-type semiconductor layer 25 and the second conductive-type semiconductor layer 29. The first conductive-type semiconductor layer 25 and second conductive-type semiconductor layer 29 may have the same width and area as shown in FIG. 11.

Before growing the nitride semiconductor layers 25, 27, and 29 on a GaN growth substrate 21, a nucleation layer and/or a buffer layer 23 formed of a nitride material may be first grown on the GaN growth substrate 21. The buffer layer 23 may also be separated into plural regions while patterning the nitride semiconductor layers 25, 27, and 29.

While forming the light emitting cells 30, the substrate 21 may be partially etched in separation regions formed by removing the nitride semiconductor layers 25, 27, and 29, thereby forming recess regions. The recess regions may be formed in a stripe shape to be spaced apart from one another or in a mesh shape to be connected to one another. When the buffer layer 23 is relatively thick, the recess regions may be defined in the buffer layer 23.

Subsequently, an insulating layer 91 may fill the recess regions. The insulating layer 91 may fill regions between the light emitting cells 90. Upper surfaces of the light emitting cells 90 may be exposed. The insulating layer 91 may be formed of an insulating material, such as SOG, silicon oxide, or silicon nitride. The insulating layer 91 may be formed by applying or depositing an insulating material on the light emitting cells 90 and partially removing the insulating material so that the upper surfaces of the second conductive-type semiconductor layers 29 are exposed. Alternatively, after forming an insulating layer 91 to be filled in the recess regions, a side insulating layer may be formed to cover sides of the light emitting cells 90.

Electrodes E may be formed on the exposed second conductive-type semiconductor layers 29. Each of the electrodes E may be electrically connected to the second conductive-type semiconductor layer 29 of one light emitting cell 90 and may extend towards an adjacent light emitting cell 90. Each electrode E may comprise a reflective layer 93 formed on the second conductive-type semiconductor layer 29 and a protective metal layer 95 for covering the reflective layer 93. The protective metal layer 95 may extend towards an adjacent light emitting cell 90. The protective metal layer 95 may be extended and disposed on the insulating layer 91. The electrodes E may be spaced apart from one another.

Figure 12:
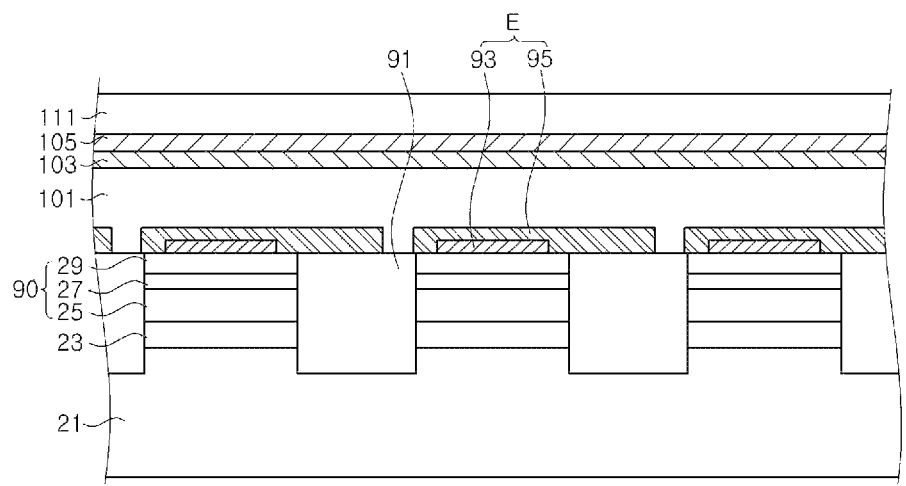

Referring to FIG. 12, an interlayer insulating layer 101 may be formed on the electrodes E. The interlayer insulating layer 101 may cover the electrodes E and may fill gaps between the electrodes E. The interlayer insulating layer may be formed of any suitable material, including, for example, a silicon oxide layer or a silicon nitride layer.

A bonding metal 103 may be formed on the interlayer insulating layer 101, and a bonding metal 105 may be formed on a second substrate 111. The bonding metal 103 may be formed of a mixture of Gold (Au) and Tin (Sn), for example, in an 80/20 AuSn weight percentage %). The second substrate 111 may be a substrate having a thermal expansion coefficient identical to that of the substrate 21.

The bonding metals 103 and 105 may be bonded to face each other, so that the second substrate 111 may be bonded to the interlayer insulating layer 101.

Figure 13:
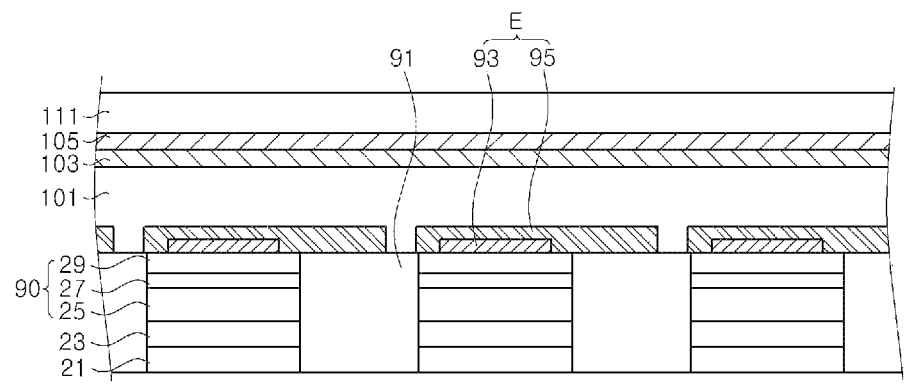

Referring to FIG. 13, the substrate 21 may be removed, at least partially, as described with reference to FIG. 6. After a portion of the substrate 21 is removed, a GaN-based material layer (e.g., residual portions of the growth substrate 21), the buffer layer 23, or the first conductive-type semiconductor layers 25 may be exposed. The insulating layer 91 filled in the recess regions may also be exposed.

Figure 14:
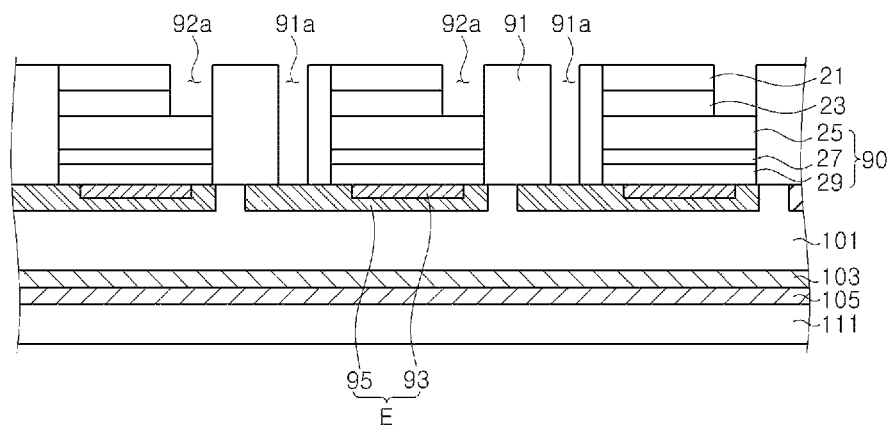

Referring to FIG. 14, openings 91a may be formed by patterning the exposed insulating layer 91 and may expose the electrodes E. In particular, the openings 91a allow the electrodes E (e.g., the protective metal layers 95) extending toward adjacent light emitting cells to be exposed. Further, openings 92a may be formed by patterning portions of the residual portions of the substrate 21 and the buffer layer 23 covering the first conductive-type semiconductor 25. The openings 92a may expose the first conductive-type semiconductor layers 25.

Figure 15:
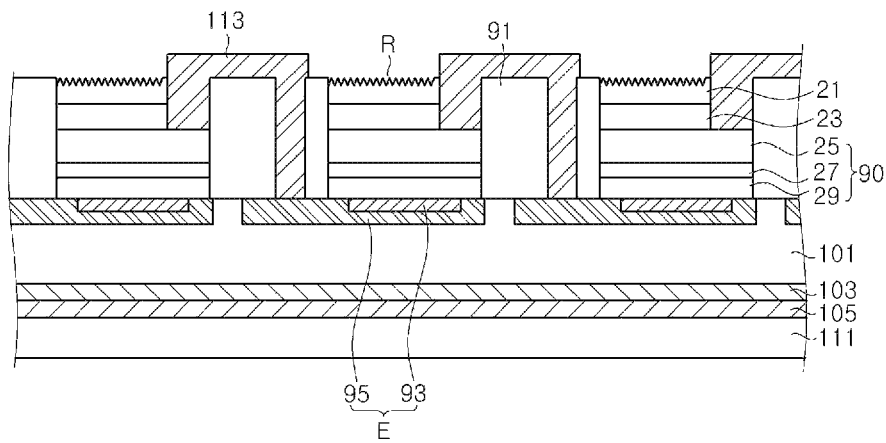

Referring to FIG. 15, wires 113 may be formed to electrically connect the light emitting cells 90. Each of the wires 113 may have one end electrically connected to the first conductive-type semiconductor layer 25 of one of the light emitting cells 90 (e.g., the upper semiconductor layer 25 in FIG. 15), and the other end electrically connected to the second conductive-type semiconductor layer 29 of an adjacent light emitting cell 90 (e.g., the electrode E electrically connected to the lower semiconductor layer 29 in FIG. 15). The residual portions of the substrate 21 and the buffer layer 23 may remain on the first conductive-type semiconductor layers 25 of the light emitting cells 90. One end of each wire 113 may be electrically connected to the first conductive-type semiconductor layer 25 through the opening 92a.

A serial array of light emitting cells 90 or at least two serial arrays of light emitting cells 90 may be formed on the substrate 111 by the wires 113. Accordingly, a light emitting device driven by a high-voltage DC or AC power source is described herein above. Alternatively, a serial array of light emitting cells 90 may be formed on the substrate 111 by the wires 113 and connected to a bridge rectifier formed on the substrate 111, whereby the light emitting cells 90 can be driven by an AC power source. The bridge rectifier may also be formed by connecting the light emitting cells 90 by the wires 113.

Before or after forming the wires 113, roughened surfaces R may be formed on GaN-based material layers for covering the first conductive-type semiconductor layers 25 (e.g., on the residual portions of the substrate 21 and the buffer layer 23). When the first conductive-type semiconductor layers 25 are exposed, roughened surfaces R may be formed on the first conductive-type semiconductor layers 25.

Before forming the wires 113, pads (not shown) may be formed on the first conductive-type semiconductor layers 25 and/or the electrodes E to improve the adhesion or ohmic contact property of the wires 113.

According to exemplary embodiments of the present invention, a light emitting device having a plurality of non-polar light emitting cells is provided. A GaN substrate may be used as a growth substrate. Further, while separating light emitting cells, the exposure of a metal may be prevented, thereby preventing the generation of metallic etching byproducts and oxidation or etching damage of a reflective layer.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting device, comprising:
   a substrate;
   a plurality of non-polar or semi-polar light emitting cells formed on the substrate and spaced apart from one another, each of the light emitting cells comprising a first conductive-type upper semiconductor layer, an active layer, and a second conductive-type lower semiconductor layer;
   material layers covered by the first conductive-type upper semiconductor layer of the light emitting cells;
   an insulating layer disposed on the light emitting cells and filling spaces between the material layers;
   at least one wire to electrically connect the light emitting cells under the insulating layer; and
   an interlayer insulating layer to cover the at least one wire, the interlayer insulating layer being interposed between the substrate and the light emitting cells.

2. The light emitting device of claim 1, wherein the material layers comprise a buffer layer or a residual portion of the substrate, and wherein the material layers comprise Gallium-Nitride based material layers.

3. The light emitting device of claim 1, wherein each of the material layers has a roughened surface.

4. The light emitting device of claim 1, further comprising a reflective layer interposed between the interlayer insulating layer and the second conductive-type lower semiconductor layer.

5. The light emitting device of claim 4, further comprising a protective metal layer to cover the reflective layer.

6. The light emitting device of claim 5, wherein each of the at least one wire is configured to connect the protective metal layer of one of the light emitting cells to the first conductive-type semiconductor layer of another light emitting cell adjacent to the one of the light emitting cells.

7. A light emitting device having a plurality of non-polar light emitting cells, the light emitting device comprising:
   a substrate;
   a plurality of non-polar light emitting cells spaced apart from one another on the substrate, each of the light emitting cells comprising a first conductive-type upper semiconductor layer, an active layer, and a second conductive-type lower semiconductor layer;
   electrodes formed on the light emitting cells, the electrodes being electrically connected to the second conductive-type lower semiconductor layer of one of the light emitting cells and extending towards another light emitting cell adjacent to the one of the light emitting cells;
   an insulating layer to fill spaces between the light emitting cells above the electrodes, the insulating layer having at least one opening for exposing the electrodes; and
   at least one wire to connect the light emitting cells, the at least one wire having one end electrically connected to the first conductive-type upper semiconductor layer of the one of the light emitting cells and another end of the at least one wire being electrically connected to the electrode electrically connected to the second conductive-type lower semiconductor layer of the adjacent light emitting cell through the at least one opening of the insulating layer.

8. The light emitting device of claim 7, further comprising Gallium Nitride (GaN)-based material layers to cover the first conductive-type upper semiconductor layer of the light emitting cells.

9. The light emitting device of claim 8, wherein each of the GaN-based material layers comprise a buffer layer or a residual portion of the substrate.

10. The light emitting device of claim 7, wherein each of the GaN-based material layers has a roughened surface.

11. The light emitting device of claim 7, wherein each of the electrodes comprises a reflective layer and a protective metal layer to cover the reflective layer.

* * * * *